(12) United States Patent
Rivoir

(10) Patent No.: US 12,124,359 B2
(45) Date of Patent: Oct. 22, 2024

(54) SYSTEMS AND METHODS FOR DEVICE TESTING TO AVOID RESOURCE CONFLICTS FOR A LARGE NUMBER OF TEST SCENARIOS

(71) Applicant: Advantest Corporation, Tokyo (JP)

(72) Inventor: Jochen Rivoir, Magstadt (DE)

(73) Assignee: Advantest Corporation, Tokyo (JP)

( * ) Notice: Subject to any disclaimer, the term of this patent is extended or adjusted under 35 U.S.C. 154(b) by 101 days.

(21) Appl. No.: 17/732,345

(22) Filed: Apr. 28, 2022

(65) Prior Publication Data

US 2022/0253375 A1 Aug. 11, 2022

Related U.S. Application Data

(63) Continuation of application No. PCT/EP2020/070599, filed on Jul. 21, 2020.

(51) Int. Cl.
*G06F 11/07* (2006.01)
*G06F 11/26* (2006.01)
*G06F 11/36* (2006.01)
*G06F 18/214* (2023.01)
*G06N 20/00* (2019.01)
G06F 11/263 (2006.01)
G06F 11/273 (2006.01)

(52) U.S. Cl.
CPC ...... *G06F 11/3684* (2013.01); *G06F 11/3688* (2013.01); *G06F 18/2148* (2023.01); *G06N 20/00* (2019.01); G06F 11/263 (2013.01); G06F 11/2733 (2013.01)

(58) Field of Classification Search
CPC ............ G06F 11/3684; G06F 11/3688; G06F 11/263; G06F 11/2733; G06F 18/2148; G06N 20/00
See application file for complete search history.

(56) References Cited

U.S. PATENT DOCUMENTS

| 6,801,869 B2* | 10/2004 | McCord ............... G11C 29/006 702/117 |
| 9,588,177 B1* | 3/2017 | Atwood ............ G01R 31/3187 |
| 10,295,596 B1* | 5/2019 | Ovadia .......... G01R 31/318307 |
| 10,430,321 B1* | 10/2019 | Li ....................... G06F 11/3696 |
| 10,746,790 B1* | 8/2020 | Cook Lobo ...... G01R 31/31724 |
| 2002/0155628 A1* | 10/2002 | Bulaga .................... H01L 22/20 257/E21.525 |

(Continued)

OTHER PUBLICATIONS

Gregory Gay et al., The Risks of Coverage-Directed Test Case Generation, Aug. 2015, [Retrieved on Jun. 3, 2024]. Retrieved from the internet: <URL: https://ieeexplore.ieee.org/stamp/stamp.jsp?arnumber=7081779> 17 Pages (803-819) (Year: 2015).*

*Primary Examiner* — Anibal Rivera

(57) ABSTRACT

Systems and methods for performing device testing using automatic test equipment that can advantageously utilize relatively large numbers of test scenarios and activities including multiple test steps and resources and that prevents test parameters from conflicting or colliding to improve test performance and accuracy are disclosed herein. The test activities of a given test scenario can be configured to be executed concurrently. The test activities can be associated with one or more test parameters characterized by respective test parameter values and/or are associated with one or more constraints.

20 Claims, 8 Drawing Sheets

(56) References Cited

U.S. PATENT DOCUMENTS

| | | | |
|---|---|---|---|
| 2005/0235263 A1 | 10/2005 | Bundy et al. | |
| 2009/0119054 A1* | 5/2009 | Adachi | G01R 31/318314 |
| | | | 702/119 |
| 2014/0143600 A1* | 5/2014 | Hutner | G06F 11/2294 |
| | | | 714/E11.021 |
| 2014/0237291 A1* | 8/2014 | Elston | G01R 31/31903 |
| | | | 714/25 |
| 2015/0253384 A1 | 9/2015 | Chen et al. | |
| 2019/0033373 A1* | 1/2019 | Frank | G01R 31/31713 |
| 2020/0355743 A1* | 11/2020 | Lim | G01R 31/31908 |

\* cited by examiner

| test activity | resources (IP cores, ATE) | parameters | results |
|---|---|---|---|
| A1: CPU2 writes data to Mem3 and checks content | R1: CPU2<br>R2: Mem3<br>R3: ATE DPS for core supply | P1: bandwidth<br>P2: DPS voltage | r1: #fail<br>r2: current |
| A2: MBIST of Mem3 | R2: Mem3 | | r3: #fail |
| A3: MPEG self-test | R4: MPEG | P3: blocksize | r4: pass/fail |
| ... | | | |

Fig. 3

| test activity | test resources (ATE, on-chip) | | | | |
|---|---|---|---|---|---|
| | R1 | R2 | R3 | R4 | ... |
| A1 | x | x | x | | |
| A2 | | x | | | |
| A3 | | | | x | |
| ... | | | | | |

Fig. 4

| test scenario | test activities | | |
|---|---|---|---|
| | A1 | A2 | A3 |
| S1 | x | | |
| S2 | | x | |
| S3 | | | x |
| S4 | x | | x |
| S5 | | x | x |

Fig. 5

| test step | test scenario | test activities and parameters | | | | | | |
|---|---|---|---|---|---|---|---|---|
| | | A1 | P1 band-width | P2 DPS volt. | A2 | A3 | P3 block-size | ... |
| 1 | S1 | x | 10 GB/s | 0.9 V | | | | |
| 2 | S1 | x | 20 GB/s | 0.86 V | | | | |
| 3 | S2 | | | | x | | | |
| 4 | S3 | | | | | x | 128 kb | |
| 5 | S3 | | | | | x | 1 MB | |
| 6 | S4 | x | 50 GB/s | 1.04 V | | x | 6 MB | |
| 7 | S4 | x | 3 GB/s | 0.97 V | | x | 500 kb | |
| 8 | S4 | x | 27 GB/s | 0.88 V | | x | 21 MB | |
| 9 | S5 | | | | x | x | 7 MB | |
| 10 | S5 | | | | x | x | 780 kb | |
| 11 | S5 | | | | x | x | 13 MB | |
| ... | ... | | | | | | | |

Fig. 6

| DUT | test step | test results ||||  overall OCST result from r1, r3, r4 |
|---|---|---|---|---|---|---|
| | | r1 (#fails) | r2 (current) | r3 (#fails) | r4(p/f) | |
| DUT 1 | 6 | | | | | |
| | 11 | | | | | |
| | 7 | | | | | |
| | 1 | | | | | |
| | 8 | | | | | |
| DUT 2 | 5 | | | | | |
| | 2 | | | | | |
| | 10 | | | | | |
| | 4 | | | | | |
| | 9 | | | | | |
| DUT3 | 3 | | | | | |
| | ... | | | | | |

| DUT | fail per test step | | | | | | | | |
|---|---|---|---|---|---|---|---|---|---|
| | 1 | 2 | 3 | 4 | 5 | 6 | 7 | 8 | ... |
| DUT1 | P | P | P | P | P | F | P | P | |
| DUT2 | P | F | P | F | P | P | P | P | |
| DUT3 | F | P | P | P | P | F | P | P | |
| DUT4 | P | P | P | P | P | P | P | F | |
| | | | | | | | | | |

Fig. 8

| | | SLT | |
|---|---|---|---|
| | | pass | fail |
| OCST suite | pass | 9900 | 5 |
| | fail | 25 | 70 |

Fig. 9

| DUT | test step | test activities | | | test resources | | | | test results | | | | SLT result |
|---|---|---|---|---|---|---|---|---|---|---|---|---|---|
| | | A1 | A2 | A3 | R1 | R2 | R3 | R4 | r1 | r2 | r3 | r4 | |
| DUT 1 | 6 | x | | x | x | x | x | x | 0 | 0.8V | 0 | 0 | fail |
| ... | | | | | | | | | | | | | |

| DUT | test step | test activities | | | test resources | | | | test results | | | | OCST result |
|---|---|---|---|---|---|---|---|---|---|---|---|---|---|
| | | A1 | A2 | A3 | R1 | R2 | R3 | R4 | r1 | r2 | r3 | r4 | |
| DUT 1 | 6 | x | | x | x | x | x | x | 0 | 0.8V | 0 | 0 | fail |
| ... | | | | | | | | | | | | | |

SYSTEMS AND METHODS FOR DEVICE TESTING TO AVOID RESOURCE CONFLICTS FOR A LARGE NUMBER OF TEST SCENARIOS

CROSS-REFERENCE TO RELATED APPLICATION

The present invention is related to and claims priority to International Patent Application No. PCT/EP2020/070599 filed on Jul. 21, 2020 with the European Patent Office, which is incorporated herein by reference as if fully set forth herein, under 35 U.S.C. § 120 and 363.

FIELD

Embodiments of the present invention generally relate to the field of device testing. More specifically, embodiments of the present invention relate to methods and systems for performing tests using a plurality of test scenarios.

BACKGROUND

A device or equipment under test (e.g., a DUT) is typically tested to determine the performance and consistency of the operation of the device before the device is sold. The device can be tested using a large variety of test cases, and the result of the test cases is compared to an expected output result. When the result of a test case does not match the expected output value, debugging is performed to identify and correct any defects that result from the device and/or to bin the device based on performance.

A DUT is usually tested by automatic or automated test equipment (ATE) that conducts complex testing using software and automation to improve efficiency. The DUT may be a memory device or other component intended to be integrated into a final product, such as a computer or other electronic device (e.g., a smartphone or appliance).

During testing, some devices fail system level tests (SLT) although they pass structural and/or parametric tests. This is usually attributed to unrealistic test conditions during structural tests. For example, an activity pattern across the die area is very different during structural tests compared to system level tests. Structural tests spend most of the time with shift operations where the frequency is very low, but the pattern activity is very high. This leads to an unnatural loading of power supplies and therefore unrealistic voltage profiles versus location on die and time. As another example, the power domain crossings and/or clock domain crossings often are not included in structural tests due to difficulties in automatic test pattern generation. Faults in this area will be neither sensitized nor detected.

Structural tests suffer from unrealistic test conditions and are optimized for excellent fault detection capabilities. In contrast, SLT consist exclusively of legitimate user scenarios. Without knowledge of a fault model, it typically assumed that a failing SLT indicates a truly bad device.

One disadvantage to SLT is that a device under test (DUT) runs only a small subset of possible uses and scenarios, in only one selected environment, such as supply voltages, frequencies, temperature, etc. Another disadvantage is that SLT fails are difficult to debug, because the time between fault sensitization and detection can be extremely long and/or the exact order of all activities is unknown and/or a simulation time for SLT would be way too long.

Furthermore, SLTs have very long runtimes of around 10 minutes, and SLT is difficult to deploy in test houses when each DUT relies on a large number of system-boards that must be maintained.

Therefore, there is a need for an improvement of the system level test, which provides a better tradeoff between the number of possible user scenarios, the duration of runtimes, and test practicality.

SUMMARY

Embodiments of the present invention provide systems and methods for performing device testing using automatic test equipment that can advantageously utilize relatively large numbers of test scenarios and activities including multiple test steps and resources and that prevents test parameters from conflicting or colliding to improve test performance and accuracy. The test activities of a given test scenario can be configured to be executed concurrently. The test activities can be associated with one or more test parameters characterized by respective test parameter values and/or are associated with one or more constraints.

According to one embodiment, a method of testing a device under test (DUT) is disclosed. The method includes generating a plurality of test scenarios, where the test scenarios include a plurality of test activities for testing the DUT using DUT resources, determining non-conflicting test scenarios based on the respective test activities and DUT resources associated with the respective test activities, and performing device testing on the DUT according to the plurality of test activities using a subset of the DUT resources, where the subset of DUT resources used by the test activities are non-conflicting.

According to some embodiments, the performing device testing on the DUT according to the plurality of test activities includes performing concurrent testing on the DUT according to the plurality of test activities.

According to some embodiments, the plurality of test activities is associated with a plurality of test parameters.

According to some embodiments, the plurality of test parameters is associated with a plurality of constraints.

According to some embodiments, a first test activity of the plurality of test activities is associated with a test parameter value that is beyond a predefined test limitation.

According to some embodiments, the determining non-conflicting test scenarios based on the respective test activities and the DUT resources associated with the respective test activities is performed by a constraint solver of an automated test equipment (ATE).

According to some embodiments, the DUT includes a stress generator, and the performing device testing on the DUT includes activating the stress generator to generate controlled stress for testing the DUT.

According to some embodiments, the method includes generating a test sequence including a subset of the test activities, executing the test sequence using a controller, and collecting test data of the test sequence using the controller.

According to some embodiments, the controller is operable to communicate with the DUT and an automated test equipment operable to test the DUT, and the controller includes at least one of: an on-chip processor, and a controller card.

According to some embodiments, the controller includes a plurality of sensors distributed over the device under test area, and the controller is operable to access sensor test data generated by the plurality of sensors.

According to some embodiments, the controller is operable to determine if test data fulfills a predetermined test condition and communicate collected test data to an automated test equipment (ATE) operable to test the DUT.

According to some embodiments, the ATE is operable to analyze collected test data and optimize the test sequences based on the collected test data.

According to some embodiments, the ATE includes a machine learning (ML) unit operable to optimize test sequences, and further including the ATE training the ML unit using at least one of results of system level tests and the collected test data.

According to some embodiments, the ML unit is operable to predict results of system level tests based on the collected test data.

According to a different embodiment, a system for testing a device under test (DUT) is disclosed. The system includes a processor and a memory in communication with the processor for storing data and instructions, where the processor executes instructions to perform a method of testing the DUT. The method includes generating a plurality of test scenarios, where the test scenarios include a plurality of test activities for testing the DUT using DUT resources, determining non-conflicting test scenarios based on the respective test activities and DUT resources associated with the respective test activities, and performing device testing on the DUT according to the plurality of test activities using a subset of the DUT resources, and the subset of DUT resources used by the test activities are non-conflicting.

According to another embodiment, a non-transitory computer-readable storage medium having embedded therein program instructions, which when executed by one or more processors of a device, causes the device to execute a process for testing a device under test (DUT) is disclosed. The method includes generating a plurality of test scenarios, where the test scenarios include a plurality of test activities for testing the DUT using DUT resources, determining non-conflicting test scenarios based on the respective test activities and DUT resources associated with the respective test activities, and performing device testing on the DUT according to the plurality of test activities using a subset of the DUT resources, where the subset of DUT resources used by the test activities are non-conflicting.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 3 is a block diagram depicting exemplary test activities and inputs of a constraint solver according to embodiments of the present invention.

FIG. 4 is a block diagram depicting exemplary resource conflicts for use by a constraint solver according to embodiments of the present invention.

FIG. 5 is a block diagram depicting exemplary test scenarios for use by a constraint solver according to embodiments of the present invention.

FIG. 6 is a block diagram depicting exemplary test steps for use by a constraint solver according to embodiments of the present invention.

FIG. 7 is a block diagram depicting an exemplary empty test result table with an exemplary test sequence created by a constraint solver according to embodiments of the present invention.

FIG. 8 is a block diagram depicting exemplary fail-per-test steps used for optimizing the number of test steps according to embodiments of the present invention.

FIG. 9 is a block diagram depicting exemplary SLT testing and the OCST testing for comparison, according to an embodiment;

FIG. 10 is a block diagram depicting exemplary collected test data combined with SLT results for use as training data for a machine learning module according to embodiments of the present invention.

FIG. 11 is a block diagram depicting exemplary collected test data combined with OCST results for use as training data for a machine learning module according to embodiments of the present invention.

DETAILED DESCRIPTION

Figure 1:
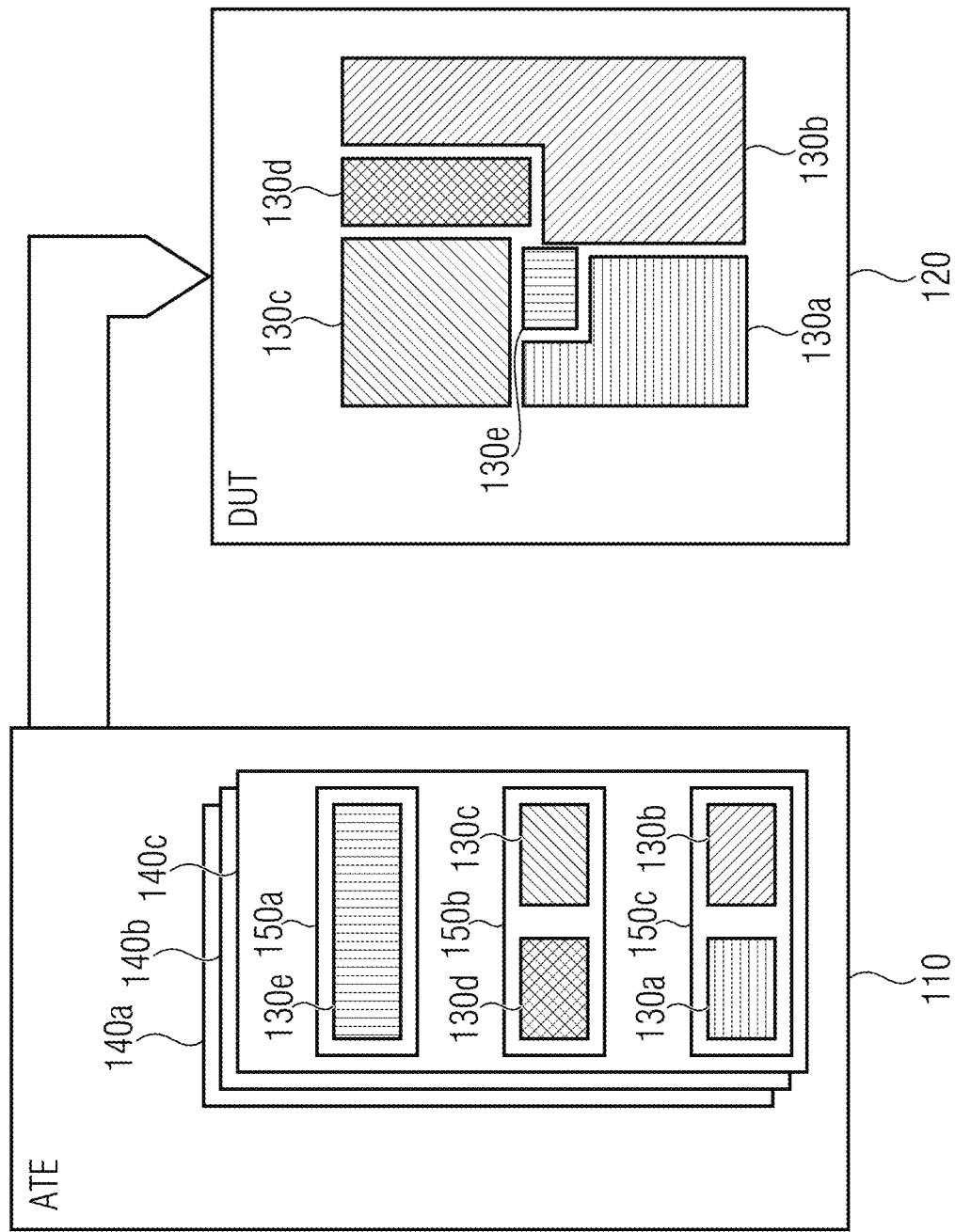
FIG. 1 is a block diagram of an exemplary test arrangement including automated test equipment for testing one or more devices under test according to embodiments of the present invention.

Reference will now be made in detail to several embodiments. While the subject matter will be described in conjunction with the alternative embodiments, it will be understood that they are not intended to limit the claimed subject matter to these embodiments. On the contrary, the claimed subject matter is intended to cover alternative, modifications, and equivalents, which may be included within the spirit and scope of the claimed subject matter as defined by the appended claims.

Furthermore, in the following detailed description, numerous specific details are set forth in order to provide a thorough understanding of the claimed subject matter. However, it will be recognized by one skilled in the art that embodiments may be practiced without these specific details or with equivalents thereof. In other instances, well-known methods, procedures, components, and circuits have not been described in detail as not to unnecessarily obscure aspects and features of the subject matter.

Portions of the detailed description that follows are presented and discussed in terms of a method. Although steps and sequencing thereof are disclosed in a figure herein (e.g., FIG. 2) describing the operations of this method, such steps and sequencing are exemplary. Embodiments are well suited to performing various other steps or variations of the steps recited in the flowchart of the figure herein, and in a sequence other than that depicted and described herein.

Some portions of the detailed description are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer-executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout, discussions utilizing terms such as "accessing," "writing," "including," "storing," "transmitting," "associating," "identifying," "encoding," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Device Testing Using Subsets of DUT Test Resources to Avoid Conflicts

FIG. 1 is a block diagram depicting an exemplary test arrangement 100 including automated test equipment (ATE) 110 for testing one or more devices under test (DUT) 120. FIG. 1 further depicts an exemplary DUT 120 including a plurality of DUT resources 130a-e. The DUT resources 130a-e may include different IP blocks, such as CPU, memory, MPEG, etc. The ATE 110 is configured to generate a plurality of test scenarios 140a-c, each including a plurality of test activities. For example, the test scenario 140c includes test activities 150a-c. Automated test equipment (ATE) 110 can include one or more processors and memory for carrying out device testing processes described herein according to embodiments of the present invention.

Test activities can be configured to use one or more DUT resources 130a-e. For example, test activity 150a is configured to use the DUT resource 130e, and test activity 150b is configured to use the DUT resources 130c and 130d. As another example, test activity 150c is configured to use the DUT resources 130a and 130b.

The automated test equipment 110 is configured to generate a plurality of test scenarios 140a-c so that the DUT resources associated with the plurality of test activities, like the test activities 150a-c (e.g., DUT resources 130a-e) do not conflict with each other. In the example of FIG. 1, test activities 150a-c are grouped into the test scenario 140c such that the DUT resources 130a-e of the test activities 150a-c are non-conflicting, allowing concurrent execution of the test activities 150a-c of test scenario 140c.

One object of on-chip-system tests (OCST) is to concurrently run a large number of realistic test activities on DUTs 120 using DUT resources 130a-e, where combinations and/or intensities of the concurrent test activities vary. Test activities can check IP blocks and contribute to the test conditions of other IP blocks through loading of supplies, clock trees and thermal coupling. Examples of test activities may include moving data blocks or executing built in self tests, such as memory built in self tests (MBIST), or logic built in self tests (LBIST).

The OCST controller can perform structural tests, such as LBIST, MBIST, etc., locally in some IP blocks. These test activities are self-checking but can also serve as a stress generator to control the test conditions of other simultaneously running test activities. In test scenarios some IP cores run structural tests, while some other cores are involved e.g., in code-based test activities. The IP blocks may apply design for test (DFT) structures or techniques, such as generating stress in order to sensitize faults, increasing observability so that sensitized faults are likely to be detected, and providing access to existing structures for debug or for in-system tests. The test activities can be carried out by an on-chip-system test (OCST) that determines the most effective test conditions can attributes failures to specific test activities and associated test parameter values.

Randomization of test activities or the use of parameterizable test activities covers many combinations of local workloads mimicking relatively large numbers of realistic workload patterns that may contribute to or directly cause system-level faults. Existing or new design for tests (DFT) structures can generate controlled stress for testing and increase the observability in order to increase the likelihood of fault detection (or for higher probability fault detection). DFT structures may improve observability by, for example, the on-chip OCST controller interfaces to on-chip IJTAG for reading out on-chip sensor data. For example, additional sensors with optional threshold alarm capabilities for current temperature, max peak temperature, min peak temperature, current voltage, max peak voltage, min peak voltage, and timing violations. In razor circuits, the added sensors may further improve observability. The threshold alarm can trigger storage or saving of important system status such as program counters and memory controller registers in order to simplify debugging.

Observability may be further improved by additional sensors distributed over the die area to detect local anomalies or by connecting a processor in order to trace memory and compare its content to expectations. Assertion checkers may be included, such as protocol checkers or CRC, and a bus traffic logger may be added to measure coverage and assist in debugging.

Figure 2:
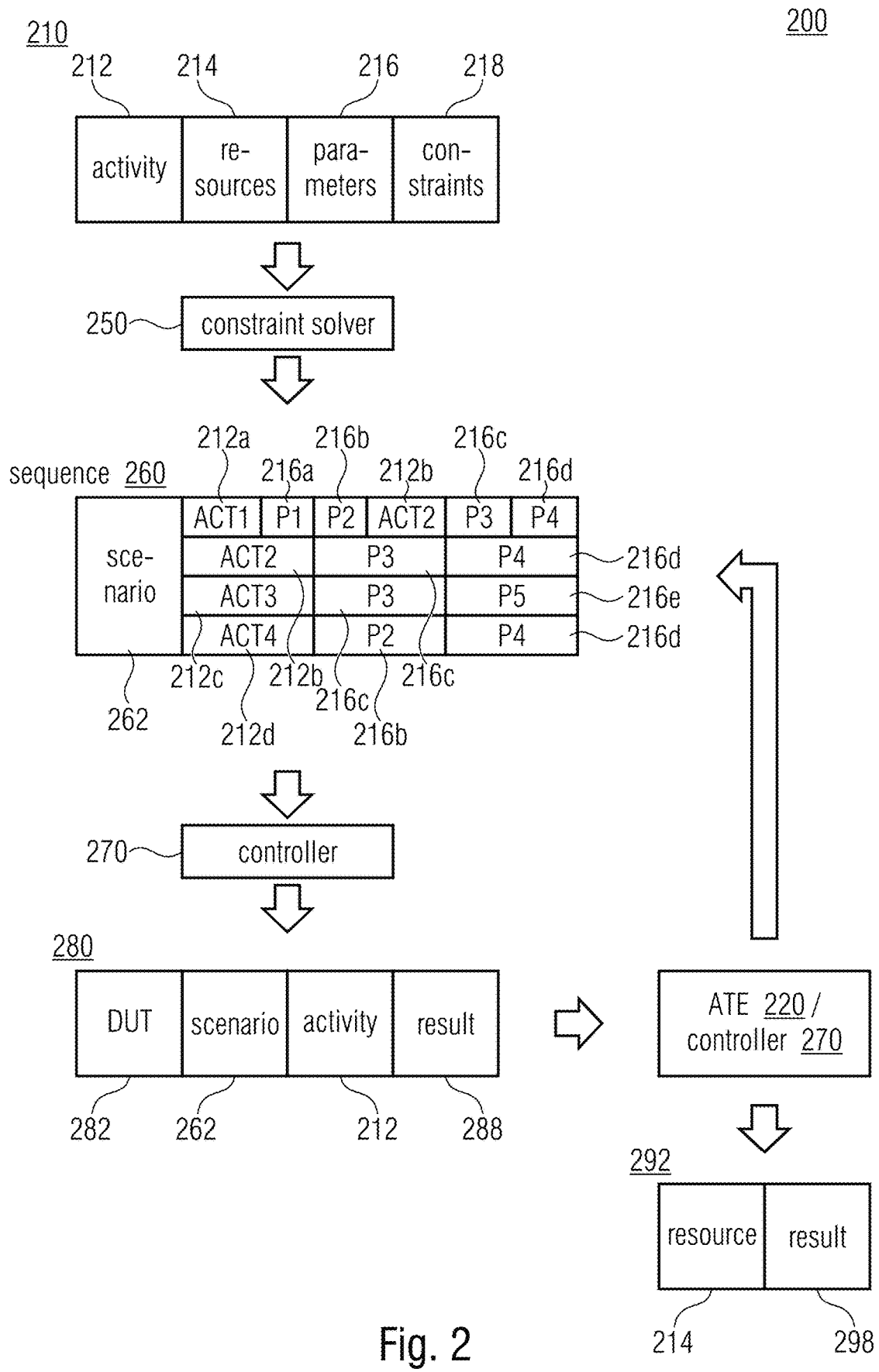
FIG. 2 is a block diagram and data flow diagram depicting an exemplary testing process conducted using automated test equipment according to embodiments of the present invention.

FIG. 2 is a block diagram depicting an exemplary sequence of computer implemented steps of a testing process 200 performed by a test arrangement (e.g., test arrangement 100 of FIG. 1). Testing process 200 starts with a test activity table 210. Test activity table 210 includes a column of test activities 212, wherein each test activity 212 may use one or more DUT resources 214. The corresponding DUT resources 214 is provided in a DUT resources 214 column. Further, the test activities 212 may have corresponding test parameters 216 and/or constraints 218 provided in separate columns. Constraints can be at the test scenario level and reference test parameters from multiple test activities.

Test activity table 210 is used by constraint solver 250 that outputs a test sequence table 260. The constraint solver 250 may be included as part of ATE 220, controller 270 or it may be a included as a separate device, as shown in FIG. 2. The exemplary constraint solver 250 of FIG. 2 has one input and one output. The input of the constraint solver 250 is fed by test activity table 210. The test sequence table 260 includes test scenarios 262, which can be similar to test scenarios 140a-c on FIG. 1. Test scenarios may include one or more test activities 212a-e, and each test activity 212a-e may include test parameter values 216a-e. The test sequence table 260 is provided to the ATE 220 or to the controller 270.

For example, the first scenario may include a first test activity 212a with test parameters P1 216a, P2 216b and test activity 212b with the test parameters P3 216c and P4 216d. The second scenario may include the second test activity 212b with the test parameters P3 216c and the test parameter P4 216d. A third scenario may include a third test activity 212c with the test parameters P3 216c and P5 216e. A fourth scenario may include a fourth test activity 212d with the test parameter P2 216b and test parameter P4 266d.

The controller 270 receives test sequence table 260 as input and outputs a test result table 280. The test result table 280 provided by the block 270 includes test results 288 of the one or more test activities 212 of test scenarios 262 executed on the DUTs 282. The test result table 280 is fed into the ATE 220 and/or or back into the controller 270. The ATE 220 or controller 270 accepts test result table 280 as input and provides an improved test sequence table 260 and/or a result table 292 as an output. The improved test sequence table 260 may further be used as input of the controller 270 to provide a new test result table 280 which can be fed back into the ATE 220 or into the controller 270.

The result table 292 provided by the ATE 220 or controller 270 includes pass/fail test results 298 of the DUT resources 296. Additionally and/or alternatively, result table 292 may include a classification of the DUT resources 296. Test activity table 210 with constraints 218, test parameters 216 and resources 214 required by the test activities 212 are provided to the constraint solver 250. Test activity table 210 or a library of test activities may further include a pool of code for the controller 270 or the OCST controller 270 to activate or execute test activities 212. The library may also know which DUT or on-chip and ATE resources are used by a given test activity 212.

The constraint solver 250 is configured to create a test sequence table 260 from test activity table 210. Test sequence table 260 includes test scenarios 262, wherein test scenarios 262 include one or more test activities 212a-e, which can coexist or can be executed concurrently without violating resource constraints 218. Test scenarios 262 are generated automatically by the constraint solver 250 running on the work station and/or on the controller 270, such as an OCST card or an on-chip OCST controller. The constraints may be modelled in PSS.

Test sequence table 260 provided by the constraint solver 250 includes the scenarios 262, wherein one or more test activities 212a-d associated with one or more test parameters 216a-e may be executed concurrently. Test parameter values characterizing the respective test parameters 216a-e are chosen randomly or so as to have an emphasis on extreme values. The order of test scenarios 262 can be generated randomly to simulate real life workload. Generated test sequence table 260 is provided to the controller 270, such as an on-chip OCST controller, which is configured to execute test scenarios 262 of test sequence table 260 to collect test data 280. The controller 270 may include interfaces to communicate with the ATE and/or interfaces to communicate with the DUT. The controller 270 may read out DUT test data and/or DUT sensor data and/or the controller may include sensors over the DUT area or die area to detect local anomalies. The measured values or collected data 280 may trigger the controller 270 to collect further information such as memory information or status information of the DUT, if the measurement values and/or the sensor values fulfill certain predefined conditions.

The controller 270 is configured to communicate the collected test data 280 or test results 288 of test activities 212 of the scenarios 262 to ATE 220. ATE 220 or controller 270 is configured to further improve the testing process and/or debug or diagnose the DUT. Controller 270 can be an on-chip OCST controller, an OCST card, or an ATE 220, for example, and is configured to dynamically create or modify the set of test parameters of test scenarios that may meet constraints and may allow to know current test parameters for debugging. Methods to create test parameter value sets for test activities 212 include randomization following a desired distribution optionally emphasizing on values, using a constraint solver to maximize coverage, or using, nested loops for an exhaustive coverage of a few test parameters.

In order to further improve the testing environment, a test learning environment may be required. Extensive characterization tests are the basis for the test learning, wherein many DUTs are exposed to many test steps or to many test scenarios. Preferably, not all DUTs 282 are exposed to the same test steps or test scenarios, in order to cover a large amount of combinations of test parameters 216. In order to avoid bias of test scenarios towards certain DUTs 282, test steps or test scenarios are executed in random permutation order.

ATE 220 or controller 270 may use machine learning or AI modules trained with the collected test result data and system level test results. The machine learning module may analyze the collected test result data 280 and the system level test result and may predict system level test results based on a new set of collected test data 280. The AI module may further be trained by measured result data without specification limits, such as on-chip sensor data or by test parameters outside specification limits, such as too low voltages or relatively high frequencies to identify system level test fails from the test results. Failing test steps or test activities outside specification limits is not necessarily evidence of bad DUTs.

According to some embodiments, machine learning modules or models predict system level test results from test step or test activity result, including measured results that are beyond specification limits, test steps or scenarios with out-of-specification test parameters and test steps, or scenarios related properties, such as properties of test activities and test resources. This approach may catch some otherwise unidentified SLT fails, but may also fail some DUTs that pass SLT and pass all other legitimate OCST tests. These cases may be considered yield loss through test and may be traded carefully against additionally found SLT fails, preferably based on a cost model. Only those additional test steps or scenarios may be included in production steps that are needed by such models. Other additional test steps can be removed again.

The ATE 220 or the controller 270 may further configured to debug and/or diagnose the DUT. As the test result table 280 includes results 288 of concurrently executed test activities 212 of test scenarios 262, there is a need for further analyses of the collected test data 280 in order to identify and/or classify faulty DUTs or DUT resources. One object of debugging or diagnosing is to identify those test parameters 216 that influence the occurrence of OCST fails most. Test parameters 216, associated with test activities 212 that involve certain actions in specific IP blocks, can provide informative information for debugging.

A machine learning module trained by a table combining test steps or scenarios with test activities, DUT resources, test parameters, test results and overall OCST result, optionally for multiple DUTs may be used for classifying or identifying faulty DUT resources. The machine learning module or machine learning feature selection algorithm may identify which test activities, test or DUT resources and test results are important to explain OCST results that contribute to the occurrence of OCST fails. The controller, or OCST controller is preferably an on-chip processor along with an optional test operating system, but can also be an OCST card that communicates with the DUT or the ATE workstation to control and carry out testing process 200. For example, the OCST controller may trigger execution of multiple test activities and read-out the pass/fail results and/or measurement results. The test activities may include a combination of optional stress generation and/or optional fault detection.

Further examples of test activities are listed below:
1. The ATE setting external test conditions of the DUT, such as DUT supply voltage or frequency, and the OCST controller controlling the ATE resources.
2. The ATE performing measurements, e.g. supply current measurements.
3. Moving data block between IP cores and checking the content before and/or afterwards.
4. Running memory tests on on-chip CPUs.
5. Running memory self-tests.
6. Compressing and decompressing images and checking the differences between the original and the decompressed image. (stress & check)
7. Running I/O loopback tests.
8. Applying stress generation, using DFT techniques.
9. Activating and reading-out of any of the observability structures, using DFT techniques.

The controller can determine which specific test scenario is executing with which test (activity) parameters, which is necessary for debugging when errors occur. Further, the controller or the OCST controller can dynamically create or modify test activity parameters based on constraints, and can access them from precomputed lists. The controller, or the processor running the OCST controller code can also generate test activities.

FIG. 3 depicts an exemplary test activity table 300 according to an embodiment. Test activity table 300 includes columns of test activities, resources, test parameters and possible results. Test activity table can list all possible test to be executed on a DUT with the required resourced, adjustable parameters and possible outcomes or results.

Test activity table 300 may be used by a constraint solver, such as the constraint solver 250 of FIG. 2, as input in order to create test sequences. A test sequence may define which test activity with which test parameters are executed on which DUT in what order. Test activity table 300 may include common test activities or DUT specific test activities. Some examples of test activities are contained by the exemplary test activity table 300.

In one example, a first test activity A1 includes a processing unit 2 (CPU2) writing data to memory 3 (MEM3) and checking the content of MEM3. The activity A1 requires the resources R1: CPU2, R2: MEM3, R3: ATE DPS for core supply. The adjustable test parameters of test activity A1 is P1: bandwidth, P2: DPS voltage. Results may include two values r1 which is a fail/pass value and r2 which is an electrical current value. Test activity A2 is a memory built in self-test (MBIST) of the MEM3, which requires the resource R2, that is MEM3, without any adjustable parameters and with an outcome of a pass/fail value as a result. Test activity A3 is an MPEG self-test, requiring an MPEG resource having adjustable block sizes as test parameter P3, with an outcome of a pass/fail value.

FIG. 4 is a resource conflict table 400 used and/or created by the constraint solver 250 of FIG. 2 according to embodiments of the present invention. The resource conflict table 400 has a test activities column and a column for every resource of the DUT. Each test activity of the table 400 uses one or more DUT test resources, which is represented by an 'X' in the respective resource column. A constraint solver, like the constraint solver 250 of FIG. 2, may access a test activity table, like table 300 of FIG. 3 to create a test sequence. Creating a test sequence can include creating a resource conflict table, such as a resource conflict table 400. The resource conflict table 400 shows which test activities are using the same DUT resources and therefore which test activities cannot run concurrently ("conflicting resources").

In the example of FIG. 4, conflicting resources of the test activities of test activity table 300. Test activity A1 uses the resources R1, R2, R3 and does not use R4. Test activity A2 uses only R2 as a resource. Test activity A3 uses the DUT resource R4.

As depicted in conflict table 400, test activity A1 and test activity A2 are conflicting test activities as both require test resource R2. Test activities A1 and A2 both require test resource R2 and therefore cannot be run concurrently. Test activity A1 and test activity A2 cannot run concurrently (e.g., cannot be put in the same test scenario). The test activities without resource conflicts ("non-conflicting") can be combined to test scenarios.

FIG. 5 shows a test scenario table 500 which might be used or created by a constraint solver 250 of FIG. 2 according to embodiments of the present invention. The test scenario table 500 includes a test scenario column and a column for each test activity provided. The test scenario table 500 includes all the possible test scenarios. The one or more test activities of test scenarios are run concurrently.

The test scenario table 500 shows all test scenarios that may be created from the test activities, like the test activities A1, A2 and A3 of test activity table 300 of FIG. 3. According to embodiments, the test activities of a test scenario are required to be non-conflicting. Conflicting test activities are shown in a resource conflict table, such as resource conflict table 400 of FIG. 4. Excluding test scenarios with conflicting test activities, taken from the resource conflict table, from all the possible test scenarios results in the test scenario table with non-conflicting test activities, such as the test scenario table 500.

For example, the test scenario table 500 includes the test scenario column and a column for every test activity, such as A1, A2, A3. According to the resource conflict table 400 of FIG. 4, A1 and A2 use the same resource R2, therefore test activity A1 and test activity A2 cannot run concurrently and cannot be in the same test scenario.

For example, test scenarios of the exemplary test activities of FIG. 3 are the test scenario S1 with test activity A1, the test scenario S2 with test activity A2, the test scenario S3 with test activity A3, the test scenario S4 with the concurrent test activities A1, A3, and the test scenario S5 with the concurrent test activities A2, A3. Due to resource constraints, no test scenario runs test activities A1 and A2 concurrently.

Whether test activities are really run concurrently can depend on test parameter settings and other unknown factors. A test sequence or a test suit consists of multiple test steps that execute a given test scenario with specified test parameter values for their test activities.

FIG. 6 shows a test step table 600 which can be used or created by a constraint solver 250 of FIG. 2 according to embodiments of the present invention. The test step table include columns of test steps, test scenarios, test activities and columns for test parameters corresponding to test activities. The test step column of the test step table 600 includes a running number to identify the different test steps. The test scenario column may include all the possible test scenarios at least once. Test scenarios may be tested more than once with several different test parameters. Similar to the test scenario table 500 of FIG. 5, the test activities of test scenarios are represented by an 'X' in the corresponding test activity column.

If the test scenario includes test activities, the corresponding test parameter columns include test parameter values.

Test parameter values are preferably generated randomly, optionally following a predefined distribution and/or with a certain percentage concentrating on extreme values that tend to produce a higher failure rate than random generated test parameter values.

A test sequence, such as test sequence table 260 of FIG. 2, can be generated from the test step table 600, by mapping test steps of the test step table 600 to DUTs randomly or following a predefined distribution to provoke more problems than a randomly mapped test sequence. The test scenario column can include all the possible test scenarios, such as test scenarios S1 to S5 from the test scenario table 500, and test scenarios may be tested with several different test parameters.

For example, test activity A1 may represent a first test step of test scenario S1 with, corresponding with test parameters P1, having a bandwidth of 10 GB/S, test parameters P2, and a DPS voltage of 0.9 V. Test step 2 can include the same test scenario S1 with different test parameters P1, a bandwidth of 20 GB/S, test parameters P2, and a DPS voltage of 0.86 V. Test step 3 may include test scenario S2 having a test activity A2 without any adjustable test parameters. Test step 4 include the test scenario S3 having test activity A3 where test parameter P3 has a block size of 128 kB. Test step 5 includes the same scenario S3 with a test parameter P3 of a block size of 1 MB. Test step 6 includes the test scenario S4 with the test activities A1 and A3, with test parameters of P1, a bandwidth of 50 GB/S, P2, DPS voltage of 1.04 V and a test parameter P3, a block size of 6 MB. Test step 7 includes the same scenario S4 with test parameter of P3, a bandwidth of 3 GB/S, P2, a DPS voltage of 0.97 V and a P3 a block size of 500 KB. Test step 8 includes the same scenario S4 with test parameters P1 a bandwidth of 27 GB/S, P2 a DPS voltage of 0.88 V and P3 a block size of 21 MB. Test step 9 includes a test scenario of S5 with a test activity A2 without test parameters and test activity A3 with a test parameter of P3, a block size of 7 MB. Test step 10 includes the same test scenario as S5 with a test parameter of P3 a block size of 780 KB. Test step 11 includes the same test scenario as S5 with a test parameter of P3 a block size of 13 MB.

FIG. 7 depicts an empty test result table 700 according to embodiments of the present invention. The test result table include columns of DUTs, test steps, test results of test activities, and an overall test result column. Test result table 700 includes the test sequence, such as test sequence table 260 of FIG. 2. The first two columns of the test result table 700, the DUT and the test step column, define which test step is performed on which DUT. The test sequence is generated from the test step table 600 of FIG. 6, by mapping test steps of the test step table 600 to DUTs randomly or following a predefined distribution and/or fulfilling pre-defined conditions to provoke more problems than the randomly mapped test sequence. An exemplary test sequence may include, for example, a DUT1 tested by the test steps 6, 11, 7, 1 and 8, and a DUT2 tested by the test steps of 5, 2, 10, 4 and 9.

The controller, such as an on-chip controller or a controller card performs the tests according to the test sequence. The results of the test activities, represented by the columns r1 (#fails), r2 (current), r3 (#fails), r4 (p/f) are collected by the controller. The overall OCST result may be based on all of the results of the test activities or on a subset of test activity results. Additionally or alternatively, the OCST result may include a classification of the DUT based on test activity results or some of test activity results.

In this example, the overall OCST result is calculated from the results r1, r3 and r4, and the measured result r2 does not contribute to the over test result because it has no specification limits in this example.

FIG. 8 shows a fail per test step table 800 including a DUT column and columns for the test steps according to embodiments of the present invention. The tested DUTs are listed in the DUT column. A row of a tested DUT includes a letter 'P' in a given test step column, if the DUT has passed the given test step and a letter 'F' with a highlighted background if the DUT has failed the given test step.

The controller or the ATE is configured to use the failure-per-test step table 800 to optimize and preferably reduce the number of test steps. For example, the number of never-failing tests and/or redundant test steps may be reduced. The task of the controller or the ATE may include selecting a minimum set of test steps to cover a set problem having a known solution.

The example of FIG. 8 includes the test results of four DUTs (DUT 1-4). DUT 1 may pass all the test steps except test step 6, DUT 2 may pass all the test steps except the test steps 2 and 4, DUT 3 may pass all the test steps except the test steps 1 and 6 and DUT 4 may pass all the test steps except the test step 8. The controller or the ATE analyzes the failure-per-test step table 800, and the controller may determine that the test steps 3, 5 and 7 never fail and can therefore be removed from the production tests. Further, test step 4 is redundant to test step 2 and may also be removed.

FIG. 9 depicts an exemplary comparison table 900 between the OCST test results and the SLT test results according to embodiments of the present invention. The exemplary comparison table 900 shows differences that may occur when testing the same set of DUTs with both OCST and SLT testing methods. In this example, 9900 devices pass and 70 fail both of the test methods OCST and SLT. 25 devices or DUTs fail the OCST test, but passing the SLT test, while only 5 DUTs pass the OCST test and fail the SLT test. In other words, OCST misses 5 devices that fail SLT, but finds problems in 25 DUT that SLT does not find, which can be a good balance when the test steps describe realistic scenarios with realistic test parameter values.

FIG. 10 depicts a training table 1000 combining the collected test data with the SLT results according to embodiments of the present invention. The training table 1000 is configured to be used as a training table or training data set for a machine learning or AI module. The training table 1000 may include all the test activities, test resources and test results of test steps conducted on DUTs with corresponding SLT results. The training table 1000 may include multiple test steps executed on multiple DUTs.

The training table 1000 may include test data collected outside, or slightly outside, of the specification of the DUTs combined with SLT results, wherein the SLT tests were conducted within the specification of the DUTs. For example, in this case, a failing OCST result is not considered a strong sign of a failing DUT, but a passed OCST test outside the specification limits may be considered as a strong indication of a good DUT and may result in classifying the DUT as a high-quality DUT.

The ATE or the controller may include a machine learning unit or AI module trained by the training table 1000 and configured to predict the SLT result from a newly conducted test step on a DUT. The machine learning unit may be used for improving the test process as well.

FIG. 11 depicts a training table 1100 that includes collected test data and overall OCST results according to embodiments of the present invention. The training table

1100 is configured to be used as a training table or training data set for a machine learning or AI module. The training table 1100 may include test activities, test resources and test results of test steps conducted on DUTs with the corresponding overall OCST results.

The table 1100 is used for debugging and diagnosis purposes. One object of debugging is to identify test parameters that influence the occurrence of OCST fails most. The ATE or the controller may include an AI or machine learning unit to identify and/or classify frequently failing DUT resources or DUTs. For efficiency reasons the table might be restricted to failing devices. The analyzers can be done across many DUTs to identify frequently occurring fault mechanisms.

Figure 12:
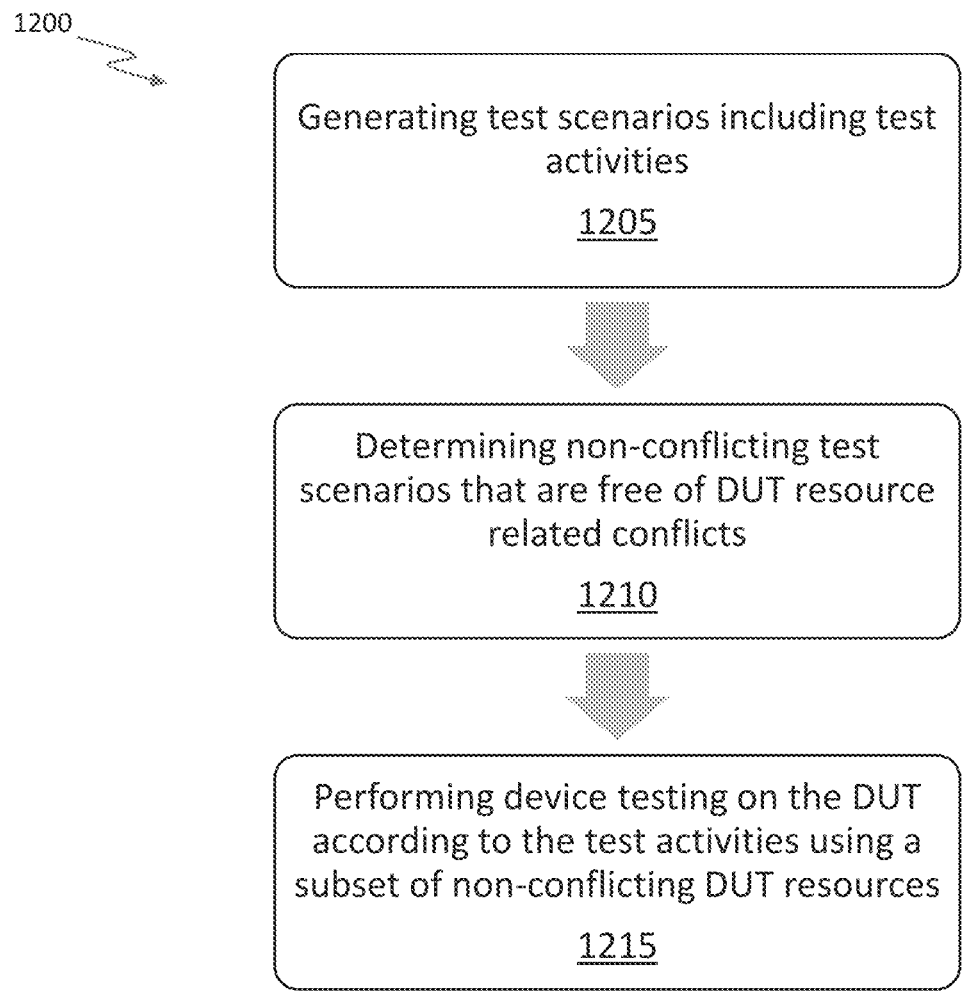
FIG. 12 is a flowchart depicting steps of an exemplary process for automatically testing a device under test using non-conflicting test scenarios according to embodiments of the present invention.

FIG. 12 is a flowchart depicting steps of an exemplary process 1200 for automatically testing a device under test using non-conflicting test scenarios according to embodiments of the present invention. According to embodiments, process 1200 can advantageously utilize relatively large numbers of test scenarios and activities including multiple test steps and resources and that prevents test parameters from conflicting or colliding to improve test performance and accuracy. The test activities of a given test scenario can be configured to be executed concurrently. The test activities can be associated with one or more test parameters characterized by respective test parameter values and/or are associated with one or more constraints.

At step 1205, a plurality of test scenarios 140*a-c*, each including a plurality of test activities, are generated. The test scenarios can be generated by an ATE, for example. The test activities can be configured to use one or more DUT resources. Step 1205 can also include receiving or accessing a test sequence table.

At step 1210, non-conflicting test scenarios that are free of DUT resource related conflicts are determined According to some embodiments, the test scenarios are identified such that the DUT resources associated with the plurality of test activities do not conflict with each other. For example, test activities can be grouped into the test scenario such that the DUT resources of the test activities are non-conflicting, allowing concurrent execution of the test activities of a test scenario. Step 1210 can also include generating a test sequence table as output.

At step 1215, device testing is performed on the DUT according to the test activities using a subset of non-conflicting DUT resources. For example, test activities can be carried out by an on-chip-system test (OCST) that determines the most effective test conditions can attribute failures to specific test activities and associated test parameter values. Examples of test activities may include moving data blocks or executing built in self tests, such as memory built in self tests (MBIST), or logic built in self tests (LBIST). The OCST controller can perform structural tests, such as LBIST, MBIST, etc., locally in some IP blocks. Moreover, randomization of test activities or the use of parameterizable test activities can be employed to cover many combinations of local workloads mimicking relatively large numbers of realistic workload patterns that may contribute to or directly cause system-level faults. Step 1215 can also include generating a result table as output.

The machine learning unit or module may be trained by the test result table 1100 in order to predict the failing DUT, or DUT resources.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

Depending on certain implementation requirements, embodiments of the invention can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to the invention include a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code can for example be stored on a machine-readable medium.

Other embodiments include the computer program for performing one of the methods described herein, stored on a machine-readable medium.

A further embodiment of the inventive method is, therefore, a data stream or a sequence of signals representing the computer program for performing one of the methods described herein. The data stream or the sequence of signals can for example be configured to be transferred via a data communication connection, for example via the internet.

A further embodiment according to the invention includes an apparatus or a system configured to transfer (for example, electronically or optically) a computer program for performing one of the methods described herein to a receiver. The receiver can, for example, be a computer, a mobile device, a memory device or the like. The apparatus or system can, for example, include a file server for transferring the computer program to the receiver.

In some embodiments, a programmable logic device (for example a field programmable gate array) can be used to perform some or all of the functionalities of the methods described herein. In some embodiments, a field programmable gate array can cooperate with a microprocessor to perform one of the methods described herein. Generally, the methods are preferably performed by any hardware apparatus.

The apparatus described herein can be implemented using a hardware apparatus, or using a computer, or using a combination of a hardware apparatus and a computer. The apparatus described herein, or any components of the apparatus described herein, can be implemented at least partially in hardware and/or in software. The methods described herein can be performed using a hardware apparatus, or using a computer, or using a combination of a hardware apparatus and a computer.

Embodiments of the present invention are thus described. While the present invention has been described in particular embodiments, it should be appreciated that the present invention should not be construed as limited by such embodiments, but rather construed according to the following claims.

What is claimed is:

1. A method of testing a device under test (DUT), the method comprising:

generating a test scenario comprising a plurality of test activities for testing the DUT using DUT resources, wherein respective test activities of the plurality of test activities use respective DUT resource subsets of the DUT resources and wherein a respective test activity of the plurality of test activities does not conflict with DUT resources used by other test activities of the plurality of test activities of the test scenario; and performing device testing on the DUT according to the test scenario to generate test results.

2. The method as described in claim 1, wherein the performing device testing on the DUT comprises performing concurrent testing on the DUT according to the plurality of test activities of the test scenario.

3. The method as described in claim 1, wherein the plurality of test activities is associated with a plurality of test parameters.

4. The method as described in claim 3, wherein the plurality of test parameters is associated with a plurality of constraints.

5. The method as described in claim 1, wherein a test activity of the plurality of test activities is associated with a test parameter value that is outside a predefined test limitation.

6. The method as described in claim 1, wherein the generating a test scenario is performed by a constraint solver of an automated test equipment (ATE).

7. The method as described in claim 1, wherein the DUT comprises a stress generator, and wherein the performing device testing on the DUT comprises activating the stress generator to generate controlled stress contemporaneously with testing the DUT.

8. The method as described in claim 1, further comprising:
generating a test sequence comprising a plurality of test scenarios;
executing the test sequence using a controller; and
collecting test data of the test sequence using the controller.

9. The method as described in claim 8, wherein the controller is operable to communicate with the DUT and an automated test equipment operable to test the DUT, and wherein the controller comprises at least one of: an on-chip processor; and a controller card.

10. The method as described in claim 8, wherein the controller comprises a plurality of sensors distributed adjacent to the device under test, and wherein the controller is operable to access sensor test data generated by the plurality of sensors.

11. The method as described in claim 8, wherein the controller is operable to determine if test data fulfills a predetermined test condition and to communicate collected test data to an automated test equipment (ATE) operable to test the DUT.

12. The method as described in claim 11, further comprising the ATE analyzing the collected test data and modifying the test sequence based on the collected test data.

13. The method as described claim 11, wherein the ATE comprises a machine learning (ML) unit operable to improve efficiency of the test sequence, and further comprising the ATE training the ML unit using at least one of: results of system level tests; and the collected test data.

14. The method as described in claim 13, further comprising the ML unit predicting the results of system level tests based on the collected test data.

15. A system for testing a device under test (DUT), the system comprising:
a processor; and
a memory coupled to the processor and storing data and instructions, wherein the processor is operable to execute instructions to perform a method of testing the DUT, the method comprising:
generating a test scenario comprising a plurality of test activities for testing the DUT using DUT resources, wherein respective test activities of the plurality of test activities use respective DUT resource subsets of the DUT resources and wherein a respective test activity of the plurality of test activities does not conflict with DUT resources used by other test activities of the plurality of test activities of the test scenario; and
performing device testing on the DUT according to the test scenario to generate test results.

16. The system as described in claim 15, wherein a test activity of the plurality of test activities is associated with a test parameter value that is outside a predefined test limitation.

17. The system as described in claim 15, wherein the generating a test scenario is performed by a constraint solver of an automated test equipment (ATE).

18. The system as described in claim 15, wherein the DUT comprises a stress generator, and wherein the performing device testing on the DUT comprises activating the stress generator to generate controlled stress contemporaneously with testing the DUT.

19. The system as described in claim 15, wherein the method further comprises:
generating a test sequence comprising a plurality of test scenarios;
executing the test sequence using a controller; and
collecting test data of the test sequence using the controller.

20. A non-transitory computer-readable storage medium having embedded therein program instructions, which when executed by one or more processors of a device, causes the device to execute a method for testing a device under test (DUT), wherein the method comprises:
generating a test scenario comprising a plurality of test activities for testing the DUT using DUT resources, wherein respective test activities of the plurality of test activities use respective DUT resource subsets of the DUT resources and wherein a respective test activity of the plurality of test activities does not conflict with DUT resources used by other test activities of the plurality of test activities of the test scenario; and
performing device testing on the DUT according to the test scenario to generate test results.

* * * * *